(12) United States Patent
Kim et al.

(10) Patent No.: US 7,705,356 B2
(45) Date of Patent: Apr. 27, 2010

(54) ELECTRONIC DEVICE, THIN FILM TRANSISTOR STRUCTURE AND FLAT PANEL DISPLAY HAVING THE SAME

(75) Inventors: Eun-Ah Kim, Suwon-si (KR); Jeong-No Lee, Suwon-si (KR); Su-Mi Lee, Suwon-si (KR); Bong-Ju Shin, Suwon-si (KR); Mi-Jin Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/018,575

(22) Filed: Jan. 23, 2008

(65) Prior Publication Data

US 2008/0128701 A1 Jun. 5, 2008

Related U.S. Application Data

(62) Division of application No. 11/170,161, filed on Jun. 30, 2005.

(30) Foreign Application Priority Data

Jun. 30, 2004 (KR) .................. 10-2004-0050445
Jun. 30, 2004 (KR) .................. 10-2004-0050446

(51) Int. Cl.
  *H01L 31/00* (2006.01)
(52) U.S. Cl. ..................... 257/59; 257/72; 257/776; 257/E27.001
(58) Field of Classification Search ............ 257/59, 257/72, 776
  See application file for complete search history.

(56) References Cited

U.S. PATENT DOCUMENTS 4,801,999 A * 1/1989 Hayward et al. ............ 257/668

(Continued)

FOREIGN PATENT DOCUMENTS

CN 1417631 5/2003

(Continued)

OTHER PUBLICATIONS

Machine Translation of JP 08-029805.*

(Continued)

*Primary Examiner*—Kenneth A Parker
*Assistant Examiner*—Anthony Ho
(74) *Attorney, Agent, or Firm*—H.C. Park & Associates, PLC

(57) ABSTRACT

The invention provides an electronic device configured to prevent or reduce electrostatic discharge from causing a pixel to malfunction. An electronic device manufactured according to the principles of the invention may include multiple conductive layers that cross but do not contact each other, wherein at least one of the conductive layers includes a width change part having a width that changes in a length direction of the at least one of the conductive layers, and a tab connected to at least one of the conductive layers at a region thereof that does not cross a neighboring conductive layer. Alternatively, the width change part may have a width that continuously varies along a length of the at least one conductive layer and may also have obtuse corner edges. The invention also provides a flat organic electroluminescent display (OELD) or LCD display device that includes such an electronic device.

22 Claims, 12 Drawing Sheets

U.S. PATENT DOCUMENTS

| | | | |
|---|---|---|---|
| 5,014,110 A * | 5/1991 | Satoh | 257/776 |
| 5,247,289 A | 9/1993 | Matsueda | |
| 5,684,365 A * | 11/1997 | Tang et al. | 315/169.3 |
| 5,897,182 A | 4/1999 | Miyawaki | |
| 6,094,248 A | 7/2000 | Hayashi | |
| 6,310,399 B1 * | 10/2001 | Feurle et al. | 257/776 |
| 6,317,176 B1 | 11/2001 | Kim et al. | |
| 6,559,904 B1 | 5/2003 | Kwak et al. | |
| 6,654,074 B1 | 11/2003 | Ha et al. | |
| 6,724,444 B2 | 4/2004 | Ashizawa et al. | |
| 2001/0052951 A1 | 12/2001 | Ashizawa et al. | |
| 2003/0086045 A1 | 5/2003 | Ono et al. | |
| 2004/0066637 A1 | 4/2004 | Imai et al. | |

FOREIGN PATENT DOCUMENTS

| | | |
|---|---|---|
| EP | 0435101 | 7/1991 |
| EP | 0717446 A3 | 6/1999 |
| JP | 55896 | 1/1993 |
| JP | 05232503 | 9/1993 |
| JP | 05259300 | 10/1993 |
| JP | 08029805 | 2/1996 |
| JP | 10509533 | 9/1998 |
| JP | 2002215096 | 7/2002 |
| JP | 2003157025 | 5/2003 |
| JP | 2004126276 | 4/2004 |

OTHER PUBLICATIONS

European Search Report dated Oct. 7, 2005.
Non-Final Office Action dated Apr. 28, 2008 (from co-pending U.S. Appl. No. 11/170,161).
Office Action dated Oct. 6, 2008 (for co-pending U.S. Appl. No. 11/170,161).
Chinese Office Action mailed Jun. 13, 2008.
First Office Action issued Oct. 23, 2009 by the State Intellectual Property Office of the People's Republic of China in Chinese Patent Application No. 200810175562.4.

* cited by examiner

ELECTRONIC DEVICE, THIN FILM TRANSISTOR STRUCTURE AND FLAT PANEL DISPLAY HAVING THE SAME

CROSS-REFERENCE TO RELATED APPLICATION

This application is a divisional application of U.S. patent application Ser. No. 11/170,161, filed on Jun. 30, 2005 which claims priority from and the benefit of Korean Patent Application Nos. 10-2004-0050445 and 10-2004-0050446, both filed on Jun. 30, 2004, which are all hereby incorporated herein by reference for all purposes as if fully set forth herein.

BACKGROUND OF THE INVENTION

1. Field of the Invention

The present invention generally relates to electronic devices such as thin film transistors (TFTs) and to flat display devices having the same. More particularly, however, the invention relates to an electronic device and to a flat display device having the same in which electrostatic damage caused by static electricity is prevented or reduced.

2. Description of the Related Art

Many kinds of display devices are used for displaying images. Recently, a variety of flat display devices have replaced cathode ray tube (CRT) displays. Flat display devices may be classified either as emissive or non-emissive depending on the type of light emission used. Emissive display devices include flat CRT display devices, plasma display panel devices, vacuum fluorescent display devices, field emission display devices, and organic/inorganic electro-luminescent display devices, and non-emissive display devices include liquid crystal display devices. Flat emissive organic electro-luminescent display (OELD) devices garner attention since they are emissive and do not include a light emitting device, such as a back light, and are capable of operating with low power consumption and at high efficiency. Advantages of OELD devices include low operating voltage, a light weight, a thin profile, wide viewing angles, and fast video response times.

A conventional electroluminescent unit of an OELD device includes a first electrode (anode), formed in a stack on a substrate, a second electrode (cathode), and an organic, light emitting layer (thin film) interposed between the first and second electrodes. In operation, OELD devices emit light of a specific wavelength using energy generated from excitons formed from recombining electrons originating from the anode and holes originating from the cathode that are injected into the organic thin film. An electron transport layer (ETL) may be interposed between the cathode and the organic emitting layer. Similarly, a hole transport layer (HTL) may be interposed between the anode and the organic emitting layer. Also, a hole injection layer (HIL) may be disposed between the anode and the HTL. Additionally, an electron injection layer (EIL) may be interposed between the cathode and the ETL.

A passive-matrix (PM) organic electro-luminescent display (OELD) device may use a manual driving method, while an active matrix (AM) type may use an active driving method. In the PM OELD device, the anodes are arranged in columns and the cathodes are arranged in rows, respectively. A row driving circuit supplies scanning signals to the cathodes while a column driving circuit supplies data signals to each pixel. On the other hand, the AM OELD device uses a thin film transistor (TFT) to control a signal inputted to a pixel. AM OELD's are widely used for implementing animation because their use of TFT's enables them to process a large number of signals quickly.

A disadvantage associated with conventional AM OELD devices is that one or more faulty pixels may develop in a display region due to generation and/or discharge of static electricity during manufacture or operation of the device.

FIG. 1A is a plan view photograph of a conventional OELD device that shows faulty pixels as bright spots. FIG. 1B is a magnified photograph of a normal pixel indicated as A in FIG. 1A, and FIG. 1C is a magnified photograph of faulty pixel indicated as B in FIG. 1A. FIGS. 1B and 1C are bottom views of the conventional OELD device of FIG. 1A. These bottom views are taken looking through the multilayered structure of the substrate and the various electrical and electroluminescent components formed on it. Thus, in FIGS. 1B and 1C, the gate lines 3a and 3b appear to be positioned above the conductive layer 5.

In FIGS. 1B and 1C, each of the pixels 1a and 1b comprises an electroluminescent unit, a gate electrode (2a in FIG. 1B and 2b in FIG. 1c), and a light emitting thin film transistor (Ma in FIG. 1B and Mb in FIG. 1C) that transmits electrical signals from a driving TFT (not shown) to the pixel. Source electrodes of the light emitting TFTs Ma and Mb are electrically connected to the driving TFTs (not shown) via conductive layers 5.

FIG. 1D is a magnified plan view of a portion indicated as B' in FIG. 1C. Referring to FIG. 1D, a conductive layer 5 may extend across other conductive layers. In the magnified bottom view of FIG. 1D, for example, the conductive layer 5 is shown crossing the gate line 3a/3b. In this exemplary drawing, the gate line 3a/3b appears to be positioned above the conductive layer 5. In operation, the gate line 3a/3b acts as a scan line and/or an extension unit of a scan line for supplying electrical signals to a thin film transistor.

To meet design specifications, the width of each gate line 3a/3b may change along a length thereof. In the conventional design illustrated in FIGS. 1B, 1C, and 1D, for example, each gate line 3a/3b changes in width at a portion thereof that crosses the conductive layer 5. As shown in FIG. 1D, the wider portion of the gate line 3b may be a width change part $A_w$, and a narrower connected portion of the gate line 3a/3b may be a crossing unit $A_c$. Both the width change part Aw and the crossing unit $A_c$ may be insulated from the conductive layer 5 and positioned within the side boundaries thereof. Because electricity tends to discharge at the pointed ends of a conductor, an electrostatic discharge (ESD) tends to occur at an angled portion $A_d$ of the width change part $A_w$ shown in FIG. 1D. In most cases, the ESD damages the corresponding pixel 1a/1b, causing it to overluminate (e.g., appear as a bright spot, such as the bright spot B shown in FIG. 1A). Such an ESD is easily induced since static electricity is concentrated at the crossing portion, and thus, the possibility of generating a short circuit between crossed conductive layers increases if an insulating layer interposed between them is damaged. As depicted in FIGS. 1B and 1C, even though the same electrical signal is inputted to the pixel 1a in FIG. 1B and the pixel 1b in FIG. 1C, the pixel 1b in FIG. 1C malfunctions and produces a bright spot having a greater brightness than the normal pixel in FIG. 1B. The greater brightness occurs because the short circuit between different conductive layers 3b and 5 creates and applies a different electrical signal than one that is desired. This undesired ESD may degrade a flat OELD's picture quality, which requires high uniformity over an entire display region of the OELD.

SUMMARY OF THE INVENTION

The present invention provides an electronic device and a TFT structure in which the generation of faulty pixels caused by electrostatic damage of conductive layers is reduced or prevented and a flat emissive organic electroluminescent display (OELD) device having the same.

An aspect of the present invention provides an electronic device that includes multiple conductive layers that cross but do not contact each other. At least one of the conductive layers includes a width change part having a width that changes in a length direction of the at least one of the conductive layers. The electronic device may further include a tab attached to either the at least one conductive layer or a neighboring conductive layer at a region thereof that is positioned away from a region where the conductive layers overlap.

Another aspect of the present invention provides a TFT structure that includes multiple conductive layers that cross but do not contact each other. At least one of the conductive layers includes a width change part having a width that changes in a length direction of the at least one of the conductive layers. The TFT structure may further include a tab connected to either the at least one conductive layer or a neighboring conductive layer at a region thereof that is positioned away from a region where the conductive layers overlap.

Another aspect of the present invention provides a flat display device including a substrate, a TFT layer formed on the substrate, at least one insulating layer formed over the TFT layer, and a pixel layer that includes more than one pixel electrically connected to the TFT layer through a via hole formed in the insulating layer. The TFT layer may comprise multiple conductive layers that cross but do not contact each other. At least one of the conductive layers includes a width change part having a width that changes in a length direction of the at least one of the conductive layers. The flat display may further include a tab connected to either the at least one conductive layer or a neighboring conductive layer at a region thereof that is positioned away from a region where the conductive layers overlap.

Another aspect of the present invention provides an electronic device that includes multiple conductive layers that cross but do not contact each other. At least one of the conductive layers includes a width change part having a width that changes in a length direction of the at least one of the conductive layers. The electronic device may further include an angle between a line segment that connects two points on a same plane of an outer line of the width change part and a line segment parallel to the length direction of the at least one of the conductive layers that is less than about 90°.

Another aspect of the present invention provides a TFT structure that includes multiple conductive layers that cross but do not contact each other. At least one of the conductive layers includes a width change part having a width that changes in a length direction of the at least one of the conductive layers. The TFT structure may further include an angle between a line segment that connects two points on a same plane of an outer line of the width change part and a line segment parallel to the length direction of the at least one of the conductive layers that is less than about 90°.

Another aspect of the present invention provides a flat display device including a substrate, a TFT layer formed on the substrate, at least one insulating layer formed over the TFT layer, and a pixel layer that includes more than one pixel electrically connected to the TFT layer through a via hole formed in the at least one insulating layer. The TFT layer may comprise multiple conductive layers that cross but do not contact each other. At least one of the conductive layers may comprise a width change part having a width that changes in a length direction of the at least one of the conductive layers. The TFT layer may further comprise an angle between a line segment that connects two points on a same plane of an outer line of the width change part and a line segment parallel to the length direction of the at least one of the conductive layers is less than about 90°.

Another aspect of the present invention provides an electronic device that includes multiple conductive layers that cross but do not contact each other, wherein at least one of the conductive layers includes a part whose cross-sectional area changes in a length direction of the at least one of the conductive layers. The electronic device may further include a tab attached to either the at least one conductive layer or a neighboring conductive layer at a region thereof that is positioned away from a region where the conductive layers overlap.

Another aspect of the present invention provides a TFT structure that includes multiple conductive layers that cross but do not contact each other, wherein at least one of the conductive layers includes a part whose cross-sectional area changes in a length direction of the at least one of the conductive layers. The TFT structure may further include a tab attached to either the at least one conductive layer or a neighboring conductive layer at a region thereof that is positioned away from a region where the conductive layers overlap.

Another aspect of the present invention provides a flat display device that includes a substrate, a TFT layer formed on the substrate, at least one insulating layer formed over the TFT layer, and a pixel layer which includes more than one pixel electrically connected to the TFT layer through a via hole formed in the insulating layer. The TFT layer may include multiple conductive layers that cross but do not contact each other. At least one of the conductive layers includes a part whose cross-sectional area changes in a length direction of the at least one of the conductive layers. The flat display device may further include a tab attached to either the at least one conductive layer or a neighboring conductive layer at a region thereof that is positioned away from a region where the conductive layers overlap.

Another aspect of the present invention provides an electronic device that includes multiple conductive layers that cross but do not contact each other, wherein at least one of the conductive layers includes a part whose cross-sectional area changes in a length direction of the at least one of the conductive layers. An angle between a line segment that connects two points on a same plane of an outer line of the part whose cross-sectional area changes and a line segment parallel to the length direction of the at least one of the conductive layers is less than 90°.

Another aspect of the present invention provides a TFT structure that includes multiple conductive layers that cross but do not contact each other, wherein at least one of the conductive layers includes a part whose cross-sectional area changes in a length direction of the at least one of the conductive layers. An angle between a line segment that connects two points on a same plane of an outer line of the part whose cross-sectional area changes and a line segment parallel to the length direction of the at least one of the conductive layers is less than 90°.

Another aspect of the present invention provides a flat display device including a substrate, a TFT layer formed on the substrate, at least one insulating layer formed over the TFT layer, and a pixel layer which includes more than one pixel electrically connected to the TFT layer through a via hole formed in the at least one insulating layer. The TFT layer includes multiple conductive layers that cross but do not in contact each other. At least one of the conductive layers includes a part whose cross-sectional area changes in a length direction of the at least one of the conductive layers. An angle between a line segment that connects two points on a same plane of an outer line of the part whose cross-sectional area changes and a line segment parallel to the length direction of the at least one of the conductive layers is less than 90°.

Another aspect of the present invention provides an electronic device that includes multiple conductive layers that cross but do not contact each other, wherein at least one of the conductive layers includes a part whose cross-sectional area changes in a length direction of the at least one of the conductive layers. The electronic device may further include a tab attached to either the at least one conductive layer or a neighboring conductive layer at a region thereof that is positioned away from a region where the conductive layers overlap.

Another aspect of the present invention provides a TFT structure that includes multiple conductive layers that cross but do not contact each other, wherein at least one of the conductive layers includes a part whose cross-sectional area changes in a length direction of the at least one of the conductive layers. The TFT structure may further include a tab attached to either the at least one conductive layer or a neighboring conductive layer at a region thereof that is positioned away from a region where the conductive layers overlap.

Another aspect of the present invention provides a flat display device including a substrate, a TFT layer formed on the substrate, at least one insulating layer formed over the TFT layer, and a pixel layer which includes more than one pixel electrically connected to the TFT layer through a via hole formed in the insulating layer. The TFT layer includes multiple conductive layers that cross but do not contact each other. At least one of the conductive layers includes a part whose cross-sectional area changes in a length direction of the at least one of the conductive layers. The flat panel display device may further include a tab attached to either the at least one conductive layer or a neighboring conductive layer at a region thereof that is positioned away from a region where the conductive layers overlap.

Another aspect of the present invention provides an electronic device that includes multiple conductive layers that cross but do not contact each other, wherein at least one of the conductive layers includes a part whose cross-sectional area changes in a length direction of the at least one of the conductive layers. An angle between a line segment that connects two points on a same plane of an outer line of the part whose cross-sectional area changes and a line segment parallel to the length direction of the at least one of the conductive layers is less than 90°.

Another aspect of the present invention provides a TFT structure that includes multiple conductive layers that cross but do not contact each other, wherein at least one of the conductive layers includes a part whose cross-sectional area changes in a length direction of the at least one of the conductive layers. An angle between a line segment that connects two points on a same plane of an outer line of the part whose cross-sectional area changes and a line segment parallel to the length direction of the at least one of the conductive layers is less than 90°.

Another aspect of the present invention provides a flat display device including a substrate, a TFT layer formed on the substrate, at least one insulating layer formed over the TFT layer, and a pixel layer which includes more than one pixel electrically connected to the TFT layer through a via hole formed in the at least one insulating layer. The TFT layer includes multiple conductive layers that cross but do not contact each other. At least one of the conductive layers includes a part whose cross-sectional area changes in a length direction of the at least one of the conductive layers. An angle between a line segment that connects two points on a same plane of an outer line of the part whose cross-sectional area changes and a line segment parallel to the length direction of the at least one of the conductive layers is less than 90°.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

The present invention will now be described more fully with reference to the accompanying drawings in which exemplary embodiments of the invention are shown.

Figure 1A:
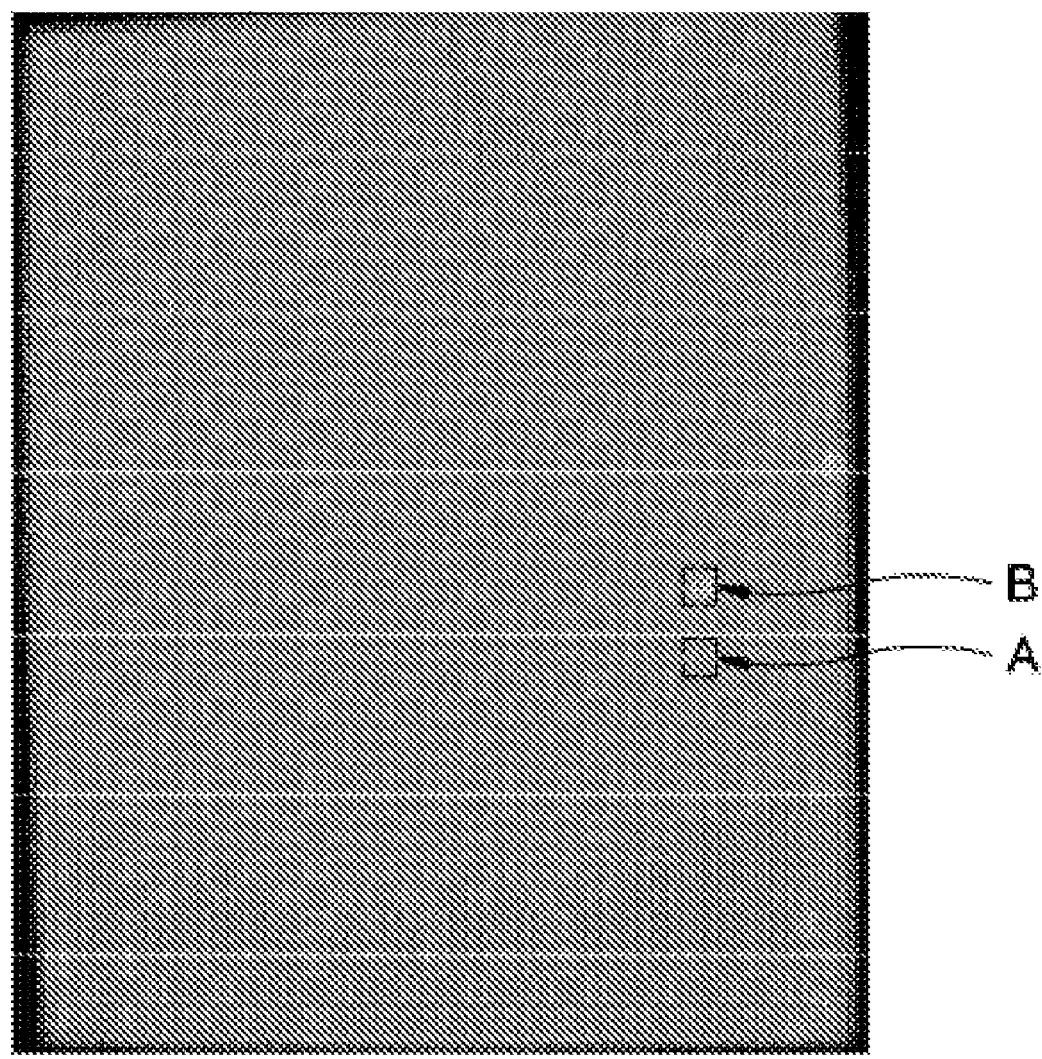
FIG. 1A is a photograph of a display region of a conventional organic electro-luminescent display device.
Figure 1B:
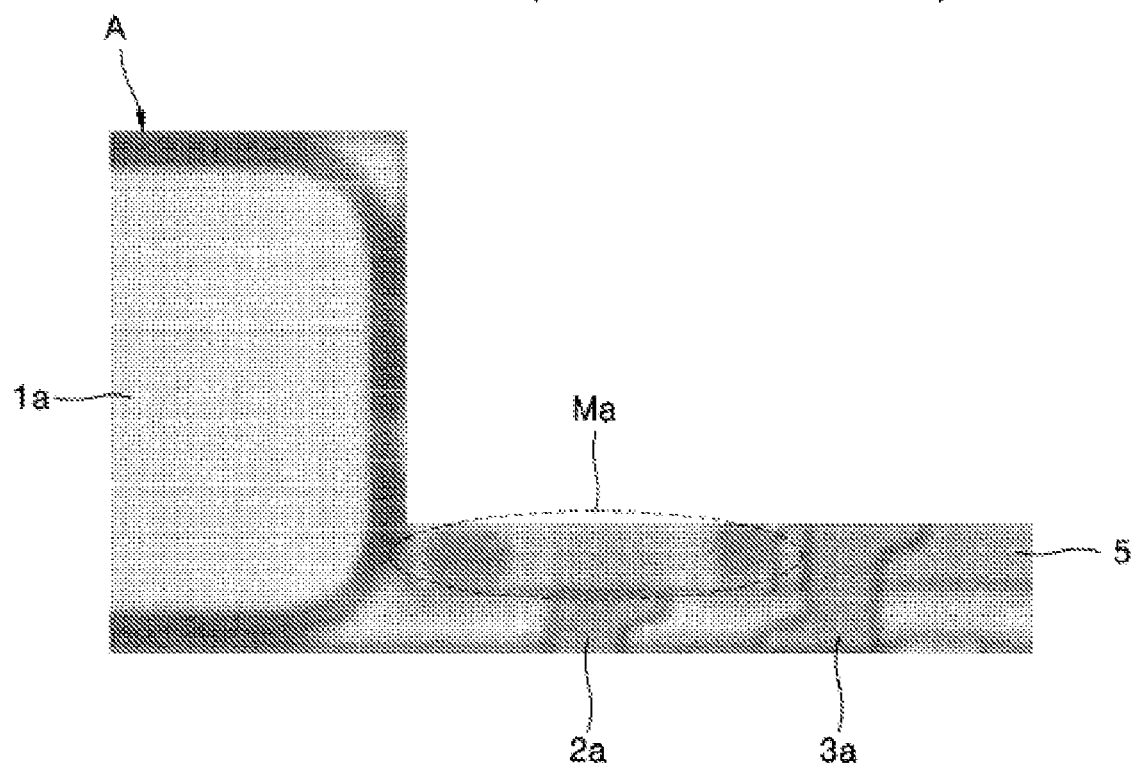
FIG. 1B is a partially magnified photograph of a normal pixel indicated as A in FIG. 1A.
Figure 1C:
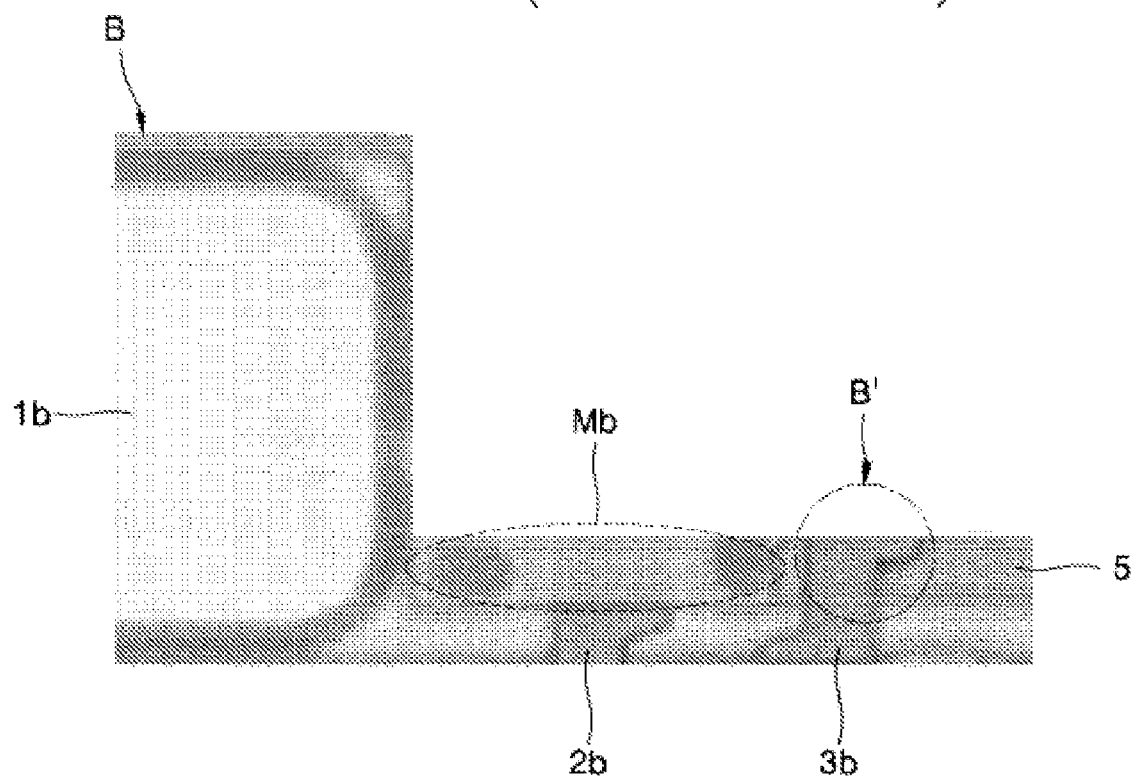
FIG. 1C is a partially magnified photograph of a faulty pixel indicated as B in FIG. 1A.
Figure 1D:
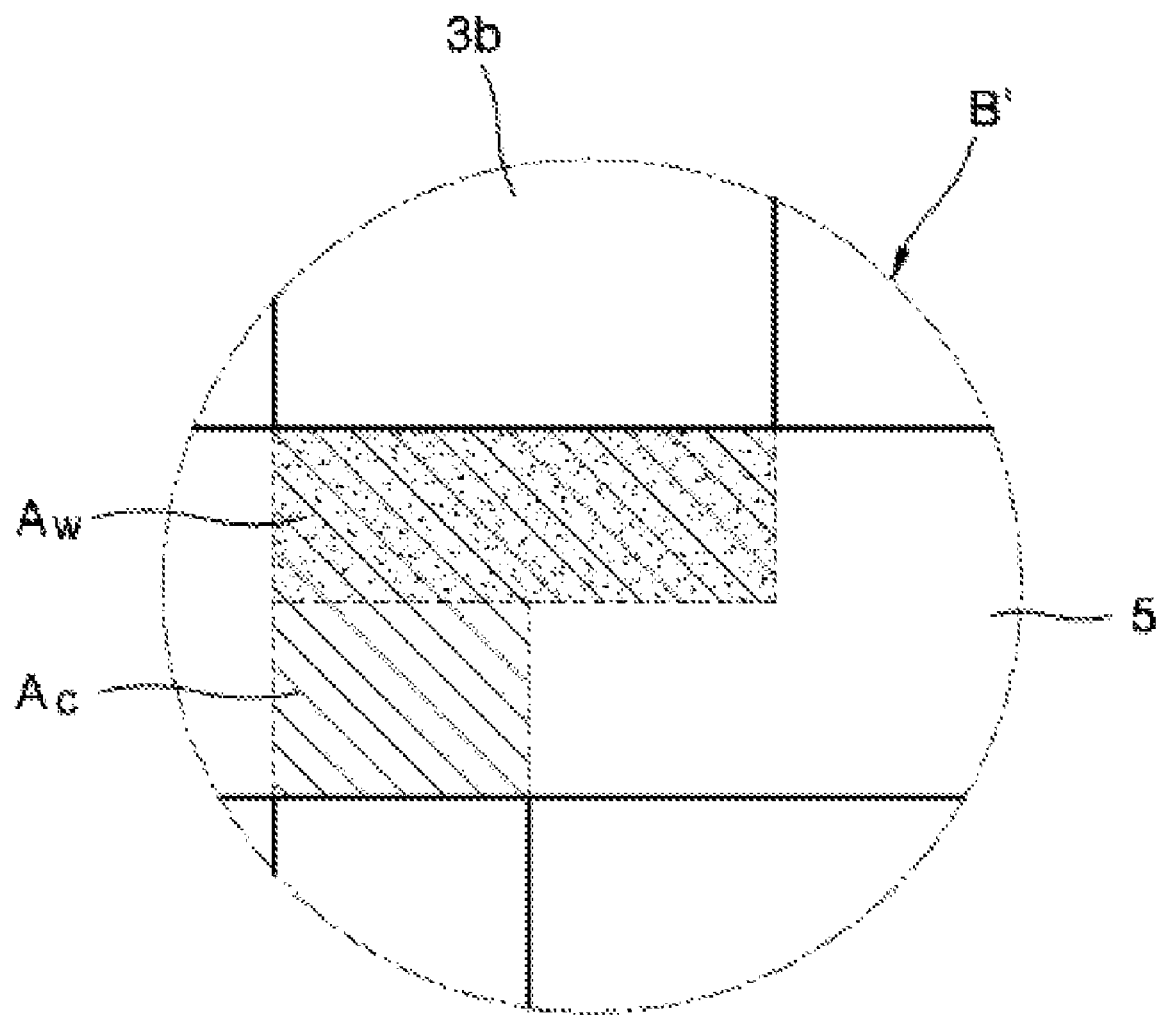
FIG. 1D is a magnified bottom view of a portion of the pixel indicated as B' in FIG. 1C.
Figure 1E:
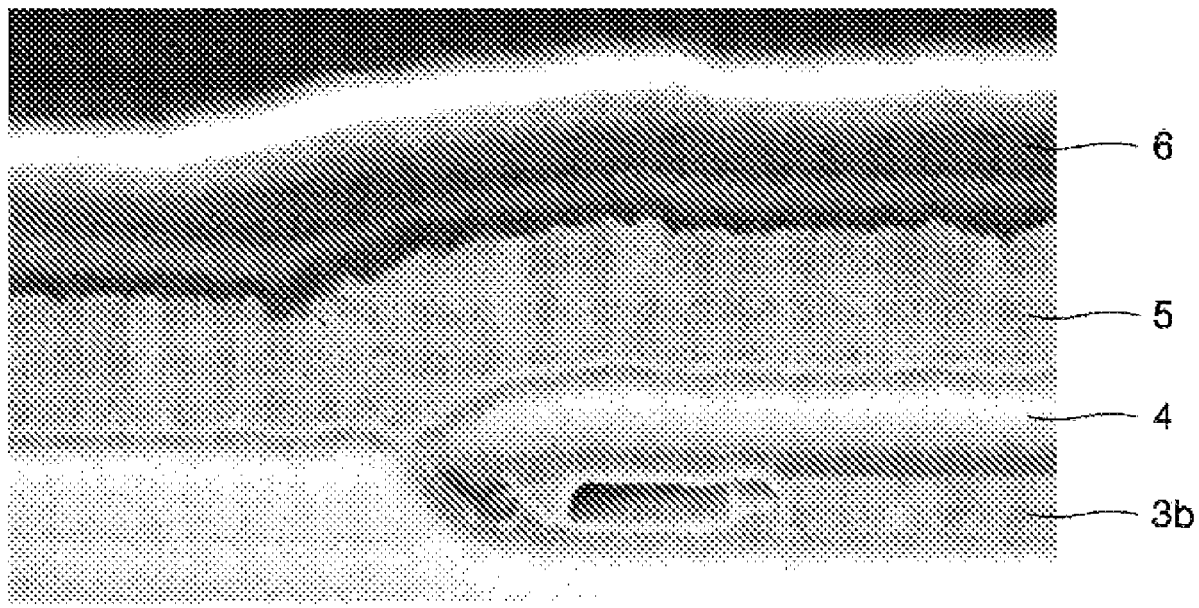
FIG. 1E is a photograph of a cross-section of a portion of the pixel indicated as B' in FIG. 1C.
Figure 2A:
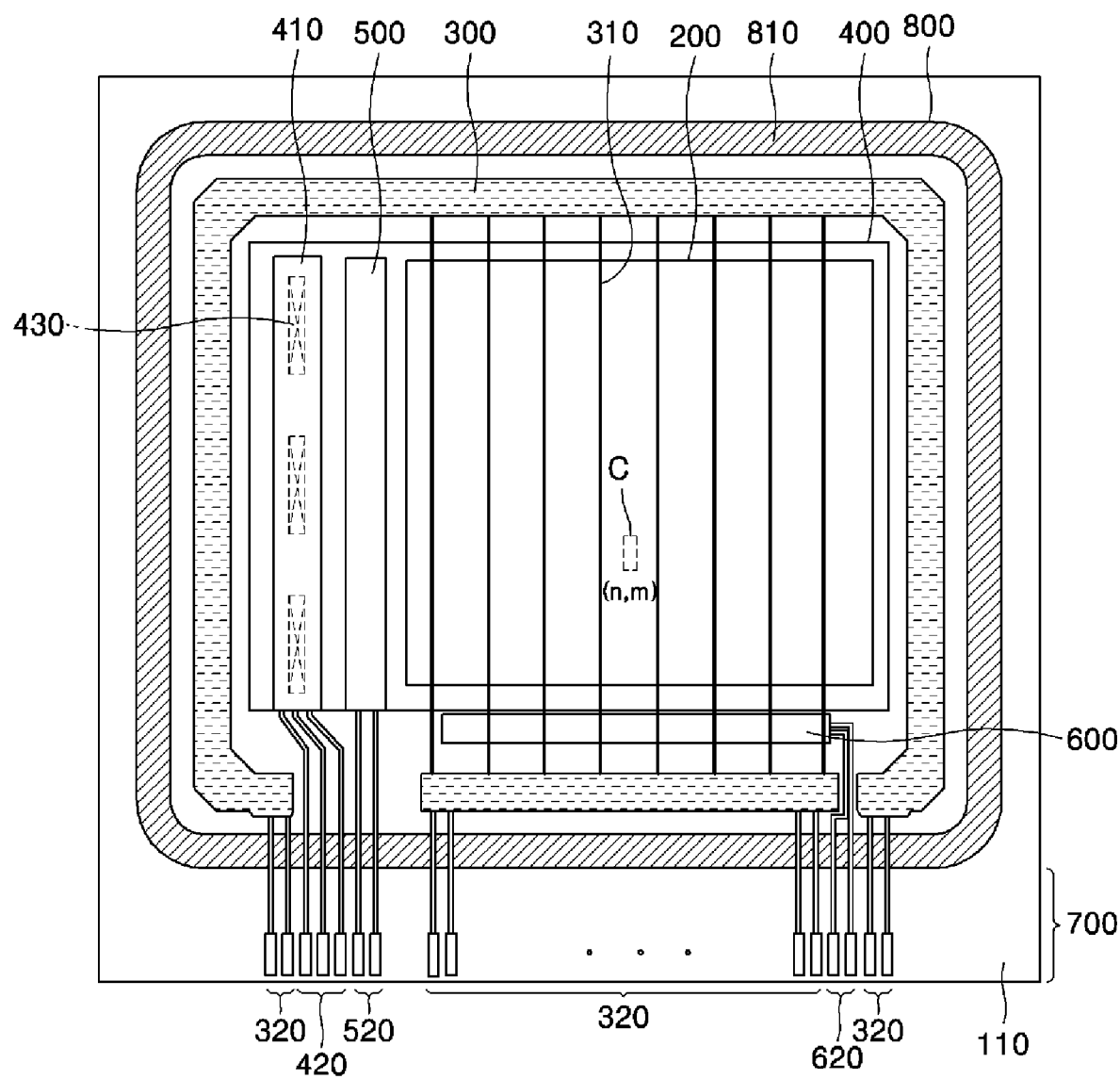
FIG. 2A is a schematic plan view of an organic electro-luminescent display device according to an embodiment of the present invention.

FIG. 2A is a schematic plan view of an organic electro-luminescent display (OELD) device manufactured according to the principles of the invention. Referring to FIG. 2A, a substrate 110 includes a display region 200 on which a light emitting device such as an organic electro-luminescent display device is disposed, a sealing member 800 that seals the substrate 110 and a sealing substrate (not shown) along the edge of the display region 200, and a terminal region 700 on which various terminals are disposed. However, the present invention is not limited thereto and can be embodied in many different forms. For example, a sealing layer that acts as a sealing member may be included.

A driving power supply line 300 for supplying power to the display region 200 may be disposed between the display region 200 and the sealing member 800. FIG. 2A illustrates an example of a driving power supply line of the invention, but the invention is not limited thereto. To ensure a uniform brightness of the display region 200, the driving power supply line 300 may surround the display region 200 to supply a uniform driving power to the entirety of the display region 200.

Figure 2B:
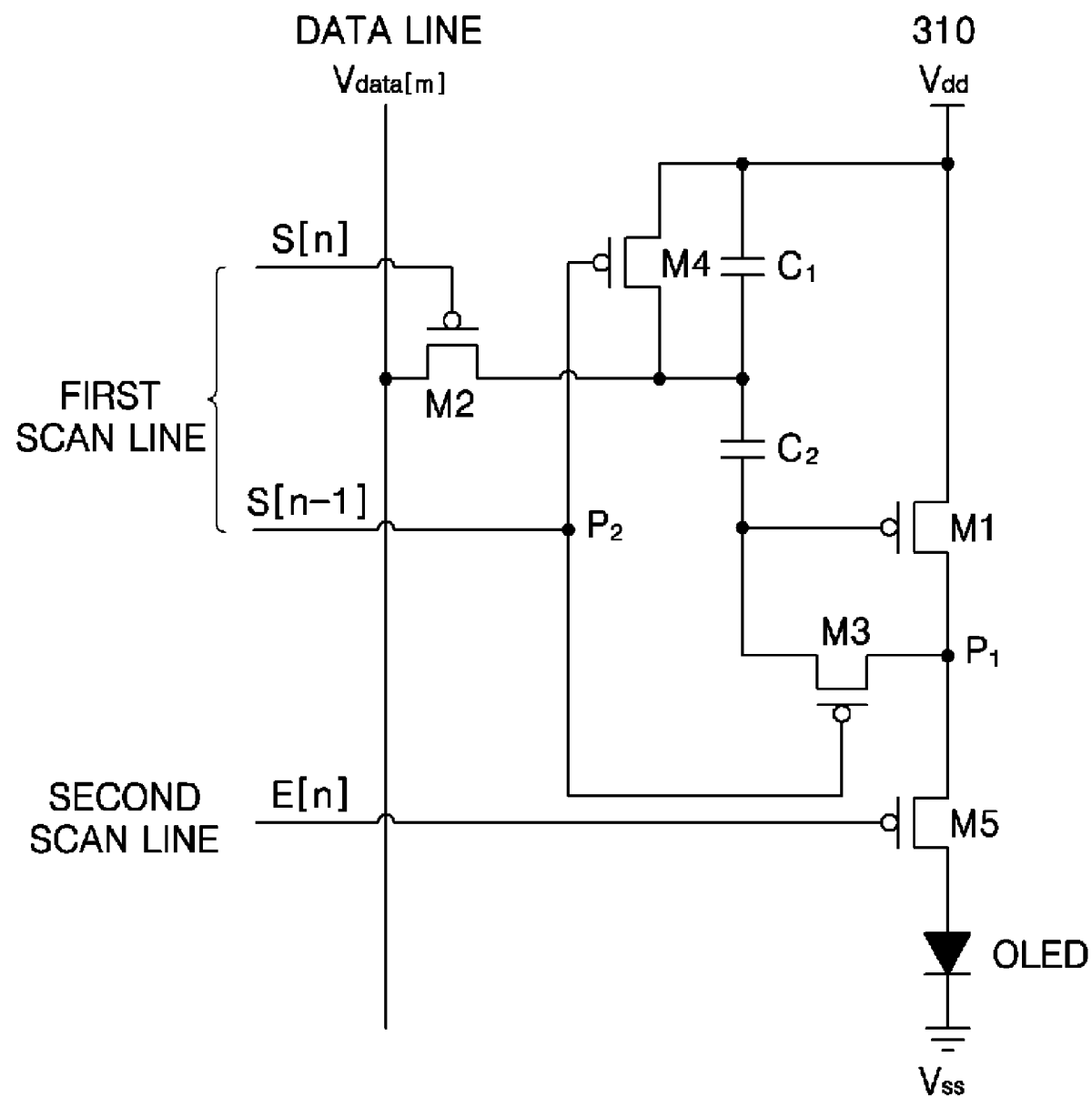
FIG. 2B is a schematic circuit diagram of a pixel of the OELD device indicated as C in FIG. 2A.
Figure 2C:
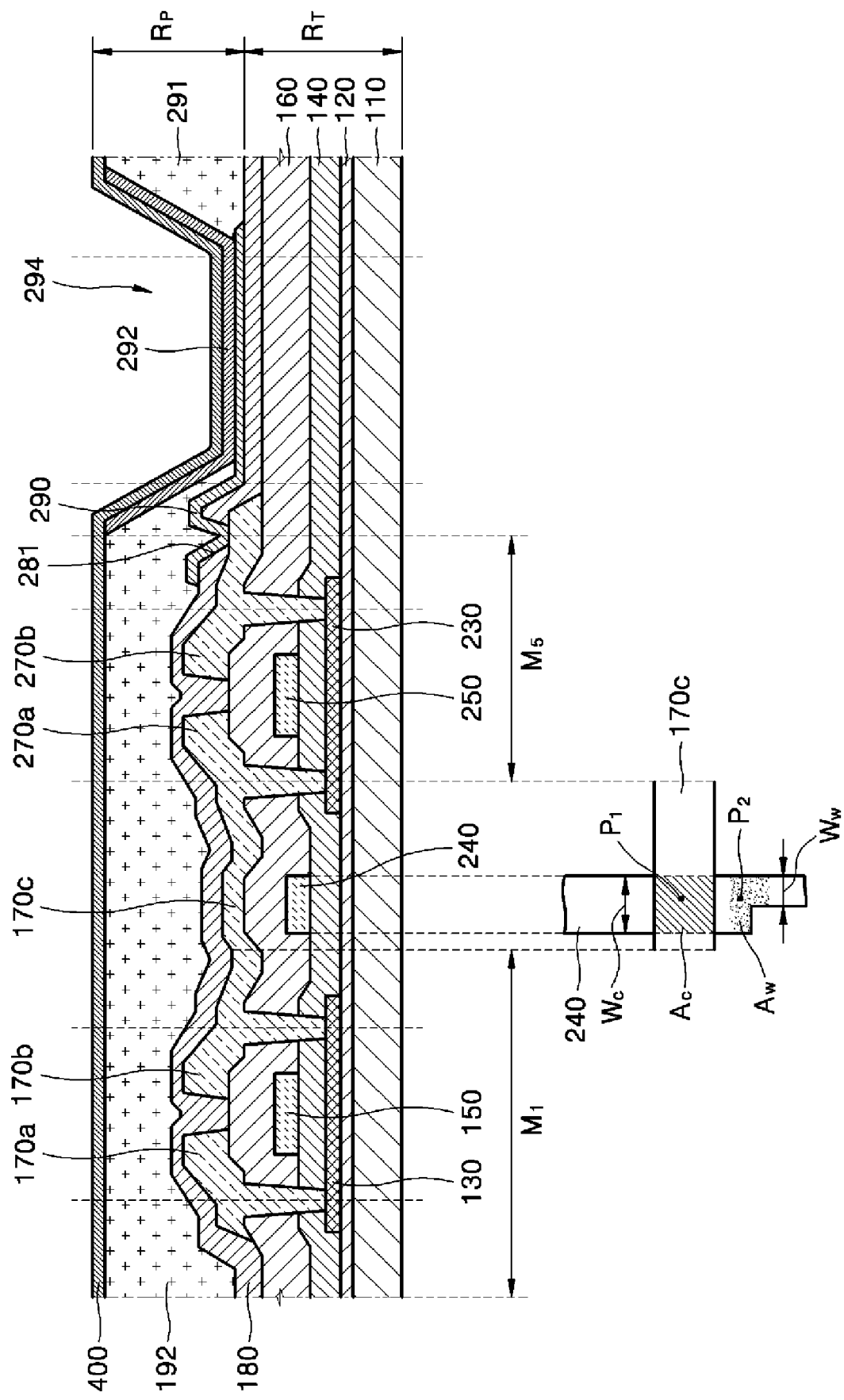
FIG. 2C is a partial cross-sectional view of a pixel indicated as C in FIG. 2A according to an embodiment of the present invention.

The driving power supply line 300 may connect to a driving power line 310, and the driving power line 310 may be disposed across the display region 200 and electrically connected to a source electrode 170a (shown in FIG. 2C) disposed under a protection layer 180 (shown in FIG. 2C).

Also, vertical and horizontal driving circuit units 500 and 600 may be disposed outside the boundaries of the display region 200. The vertical circuit unit 500 may be a scan driving circuit unit that supplies scan signals to the display region 200, and the horizontal driving circuit unit 600 may be a data driving circuit unit that supplies data signals to the display region 200. The vertical and horizontal driving circuit units 500 and 600 may be disposed outside the boundaries of the sealing region as an external IC or COG unit.

An electrode power supply line 410 that supplies electrode power to the display region 200 may be disposed outside the boundaries of the display region 200 and electrically connected to a second electrode layer formed on an upper part of the display region 200 through via holes 430 in insulating layers formed between the electrode power supply line 410 and the second electrode layer.

The driving power supply line 300, the electrode power supply line 410, and the vertical and horizontal driving circuit units 500 and 600 may include terminals 320, 420, 520, and 620, respectively, and may electrically connect via wires to a terminal unit 700 disposed outside the boundaries of the sealing region.

The display region 200 includes a plurality of pixels, which will now be described with reference to FIGS. 2B and 2C. FIG. 2B is a schematic circuit diagram of a pixel in an $n^{th}$ column and an $m^{th}$ row of the OELD device of the present embodiment indicated as C in FIG. 2A.

As shown in FIG. 2B, the pixel may comprise five transistors and two capacitors, and each of the transistors is depicted as a PMOS TFT, but the invention is not limited thereto.

In use, first scan signals and second scan signals are inputted to the display region 200 (refer to FIG. 2A) from the vertical circuit unit 500 via pluralities of first scan lines and second scan lines, respectively. First scan signals $S_{[n]}$ and $S_{[n-1]}$ and the second scan signal $E_{[n]}$ are inputted via the first scan line and the second scan line and a data voltage Vdata$_{[m]}$, which is a data signal, is inputted via the data line to the pixel in the $n^{th}$ column and $m^{th}$ row indicated as C in FIG. 2A.

A first TFT M1 supplies a current to the OLED corresponding to the data voltage applied to the first TFT M1 through a second TFT M2.

The second TFT M2 switches the data voltage applied to the data line in response to the nth select signal $S_{[n]}$ supplied to the first scan line.

A third TFT M3 diode connects the first TFT M1 in response to the $(n-1)^{th}$ select signal $S_{[n-1]}$ supplied to the first scan line.

A fourth TFT M4 supplies a constant voltage to one terminal of a first capacitor C1 in response to the n–1$^{th}$ select signal $S_{[n-1]}$ supplied to the first scan line.

A fifth TFT M5 transmits a current supplied from the first TFT M1 to the OELD in response to the light emitting signal $E_{[n]}$ applied to the second scan line.

The first capacitor C1 maintains at least a portion of a voltage between a gate and a source of the first TFT M1 for a frame time, and the second capacitor C2 applies a data voltage, which is a compensated threshold voltage, to a gate of the first TFT M1.

The operation of the OELD device that includes the TFT layer and a pixel layer of the present embodiment will now be described. The TFT layer may be a layer that includes at least one TFT and other electronic element such as a capacitor. The TFT layer may be regarded as a pixel circuit unit.

The third TFT M3 turns "on" when the n–1$^{th}$ select signal $S_{[n-1]}$ activates, and then, the first TFT M1, which is a driving thin film transistor, enters a diode-connection state, and a threshold voltage of the first TFT M1 is stored in the second capacitor C2 since the fifth TFT M5 is "off".

If a data voltage is inputted after the third TFT M3 turns "off" in response to the n–1$^{th}$ select signal $S_{[n-1]}$ and the first TFT M1 turns "on" in response to the n select signal $S_{[n]}$, the corrected data voltage which compensates a threshold voltage, is applied to a gate of the first TFT M1.

At this time, if the fifth TFT M5 turns "on" in response to the $n^{th}$ light emitting signal $E_{[n]}$, light is emitted from the OELD by transmitting a current signal adjusted by a voltage applied to a gate of the first TFT M1 to the OELD via the fifth TFT M5.

FIG. 2C is a partial cross-sectional view of an OELD that includes a pixel layer $R_P$ and a TFT layer $R_T$, that is, an electroluminescent unit and a pixel layer that includes the first TFT M1, which is a driving thin film transistor, and the fifth TFT M5, which is a switching thin film transistor for supplying electrical signals to the pixel layer.

Referring to FIG. 2C, the TFT layer like the first TFT M1 is formed on a portion of the substrate 110. A semiconductor active layer 130 of the first TFT M1 is formed on a portion of the upper surface of a buffer layer 120 formed on a surface of the substrate 110. The semiconductor active layer 130 may be an amorphous silicon layer, or may be a polycrystalline silicon layer. Even though it is not depicted in detail, the semiconductor active layer 130 may be composed of source and drain regions and a channel region doped with a P-type dopant or an N-type dopant. However, the thin film transistor including the semiconductor active layer 130 may be configured in many different ways.

A gate electrode 150 of the first TFT M1 may be disposed above a portion of the semiconductor active layer 130. The gate electrode 150 is preferably formed of a material, such as MoW and Al, in consideration of contact with a neighboring layer, surface flatness of stacked layers, and processing ability, but is not limited thereto.

A gate insulating layer 140 for insulating the gate electrode 150 from the semiconductor active layer 130 is disposed therebetween. An interlayer 160, which is an insulating layer, is a single layer or a multiple layer and is formed on the gate electrode 150 and the gate insulating layer 140. Source and drain electrodes 170a and 170b of the first TFT M1 may be formed on the interlayer 160. The source and drain electrodes 170a and 170b may be formed of a metal such as MoW and may be heat treated after forming to provide a smooth ohmic contact with the semiconductor active layer 130.

A protection layer 180, which is an insulating layer, may be composed of a passivation layer and/or a planarizing layer for protecting and/or planarizing a lower layer and formed on the source and drain electrodes 170a and 170b. The protection layer 180, as depicted in FIG. 2C, may be a single layer composed of an inorganic material such as SiNx or an organic material layer such as benzocyclobutene or acryl, and may also be formed as a stack of a plurality of layers.

The first TFT M1 electrically connects to the fifth TFT M5, which acts as switching TFT, via an extension unit 170c of the drain electrode 170b. A fifth semiconductor active layer 230 of the fifth TFT M5 may be formed on the buffer layer 120 which is formed on a surface of the substrate 110. The fifth semiconductor active layer 230 may be insulated from the second scan line and/or a fifth gate electrode 250 formed thereon by the gate insulating layer 140. The interlayer 160 and fifth source/drain electrodes 270a and 270b may be formed on a surface of the fifth gate electrode. The fifth source and drain electrodes 270a and 270b and the fifth semiconductor active layer 230 may be electrically connected via a contact hole formed in the interlayer 160 and the gate insulating layer 140. At least one protection layer 180 acting as an insulating layer may be formed on the fifth source and drain electrodes 270a and 270b, and the pixel layer $R_P$ which includes a first electrode layer 290, an electroluminescent unit 292, and a second electrode layer 400 stacked sequentially may be formed on the protection layer 180.

A method of forming the pixel layer $R_P$ will now be described. First, after forming a first electrode layer 290, a pixel defining layer 291 may be formed on a protection layer 180 outside a pixel opening region 294. The electroluminescent unit 292, which includes a light emitting layer, may be disposed on a surface of the first electrode layer 290 in the pixel opening region 294, and the second electrode layer 400 may be formed on the entire surface of the resultant product.

The electroluminescent unit 292 may be formed of a low molecule or polymer organic film. If the electroluminescent unit 292 is formed of a low molecule organic film, a HIL, a HTL, an EML, an ETL, and an EIL may be stacked in a single structure or a composite structure, and the low molecule organic materials can be used include copper phthalocyanine (CuPc), N,N'-Di(naphthalene-1-yl)-N,N'-diphenyl-benzidine (NPB), or tris-8-hydroxyquinoline aluminum (Alq3). The low molecule organic film may be formed using an evaporation method.

If the electroluminescent unit 292 is formed of a polymer organic film, it may be composed of a HTL and an EML. The HTL may be formed of PEDOT and the EML may be formed of Poly-Phenylenevinylene (PPV) and Polyfluorene. The polymer organic film may be formed using various methods including, but not limited to, a screen printing method and an ink jet printing method.

The second electrode layer 400 acts as a cathode and may be deposited on an entire upper surface of the electroluminescent unit 292. The second electrode layer 400 is not limited to being deposited on an entire upper surface. It may be formed of a material such as Al/Ca, ITO, or Mg—Ag. The second electrode layer 400 may have many different forms such as a multiple layer and may further comprise an alkali or alkali earth fluoride layer such as a LiF layer.

A first scan line and/or a scan line extension unit 240 (hereinafter, a first scan line) may be formed between the first TFT M1 and the fifth TFT M5. The first scan line 240 may cross, without contacting, an extension unit 170c of the drain electrode 170b of the first TFT M1. As depicted in FIG. 2B, the first scan line 240 may be a conduction layer via which the n-1$^{th}$ select signal $S_{[n-1]}$ is transmitted to the third and fourth TFTs M3 and M4 and includes a width change part $A_w$, a width of which changes in a length direction of the first scan line since the TFTs have different design specifications.

That is, as illustrated in the partial plan view depicted in FIG. 2C, the first scan line 240 may be formed as a conduction layer having a crossing region $A_c$ at region where at least the first scan line 240 crosses, but does not contact, the extension unit 170c. The first scan line 240 may be disposed below the extension unit 170c that extends from the drain electrode 170b. The first scan line 240 includes a width change part $A_w$, a width of which changes from a first width $W_c$ to a second width $W_w$, or from a second width $W_w$ to a first width $W_c$. The first width $W_c$ and the second width $W_w$ may be different from each other, and the width $W_c$ may be broader than the width $W_w$. The width change part $A_w$ of the first scan line 240 may also be defined as a part whose cross-sectional area changes in a length direction of the first scan line 240.

The first scan line 240 may include a tab 241 at a region thereof that does not cross the neighboring conductive layer 170c. The generation of a short circuit at the width change part $A_w$ due to electrostatic discharge is prevented since charges concentrate in the tab 241, and not in the width change part $A_w$.

The ratio of an effective width $W_s$ of the tab 241 to an effective length $W_d$ of the tab 241 can be less than a ratio of the second width $W_w$ to the first width $W_c$ so that static electricity concentrates in the tab 241. That is, $W_s/W_d < W_w/W_c < 1$. Here, the first width $W_c$ may be a measurement of the maximum width of the width change part and the second width $W_w$ may be a measurement of the minimum width of the width change part.

In the present embodiment, the first scan line 240 may be a conductive layer that includes a tab 241 and functions as a gate electrode or a gate line. However, this is an exemplary embodiment of the invention, and the invention is not limited thereto.

Figure 2D:
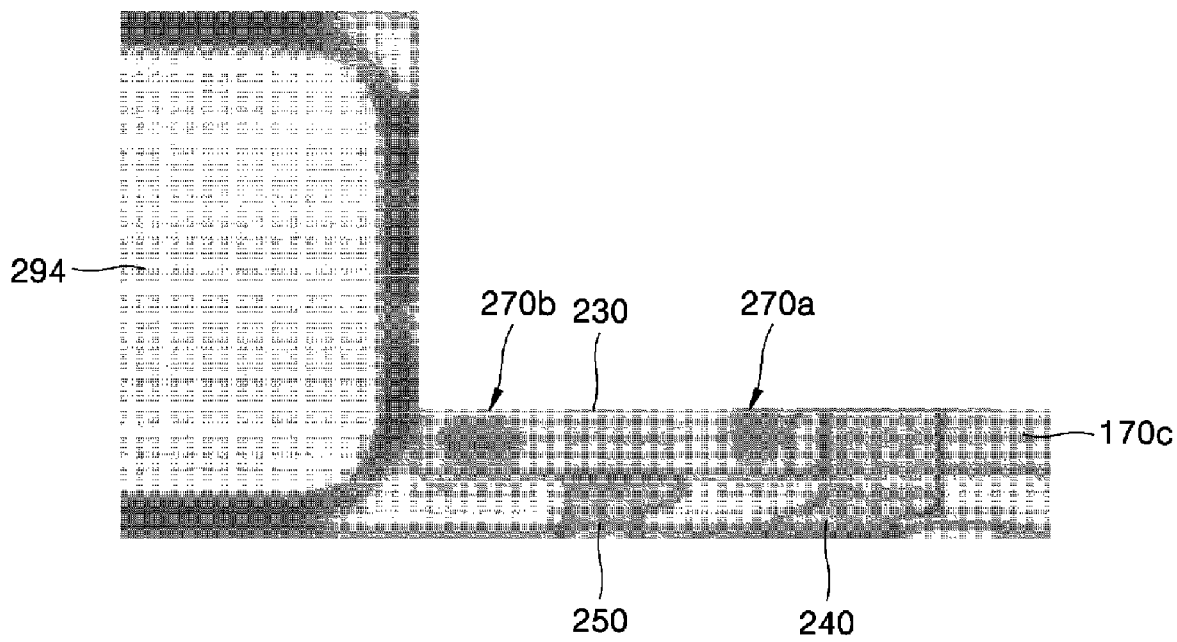
FIG. 2D is a partial plan view of a modified example of a portion shown in FIG. 2C.

As shown in FIG. 2C, a tab 241 may be formed on the first scan line 240 (or a conductive layer that is an extension of the first scan line) extending toward the first TFT M1. However, the tab 241 may be formed in many different forms as long as the tab 241 does not cross a neighboring conductive layer. Thus, the conductive layer connected to the tab 241 may be formed at the same layer as the source and drain electrodes. The tab 241 may also be formed to extend in a direction opposite the first TFT M1. Alternatively, as depicted in FIG. 2D, multiple tabs 241 may be formed on the conductive layer that includes the width change part Aw and/or on the neighboring conductive layer.

Figure 2E:
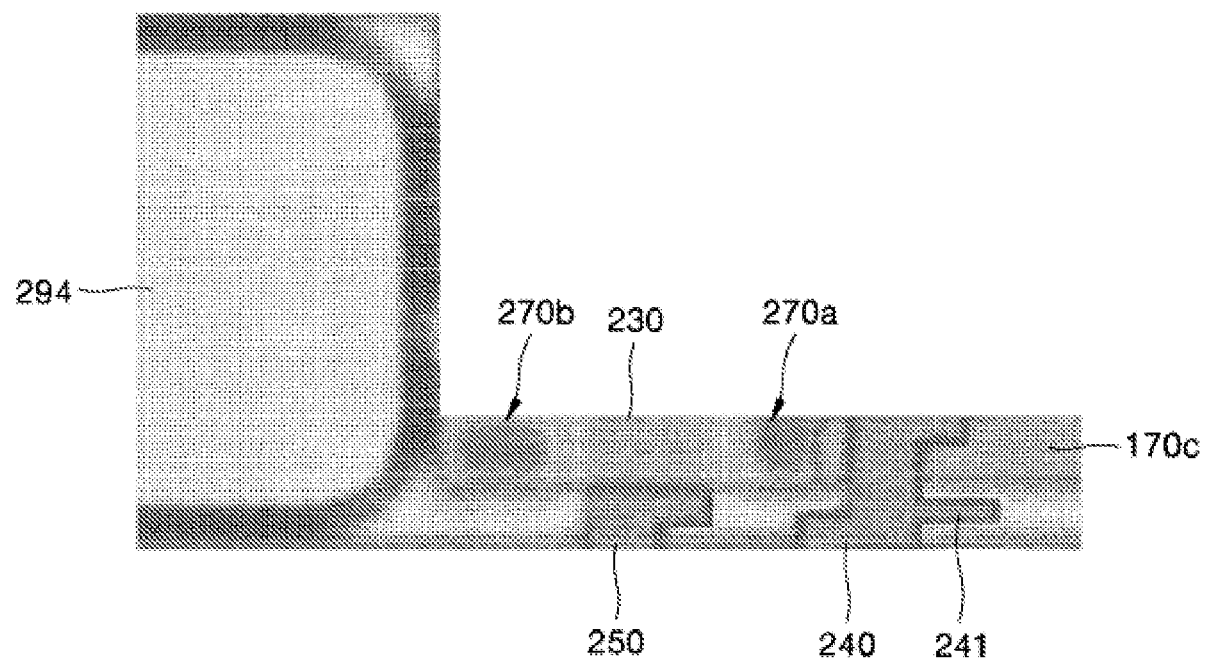
FIG. 2E is a partially magnified photograph of the pixel shown in FIG. 2C.

FIG. 2E is a plan view of a partially magnified photograph of the pixel shown in FIG. 2C. In FIG. 2E, tabs 241 connect to a region of a conductive layer. To prevent and/or reduce electrostatic discharge, the region where each tab 241 connects to the conductive layer is positioned away from a region where the conductive layers overlap. This configuration may prevent or reduce electrostatic damage to the conductive layers of the TFT layer since the electrostatic discharge does not occur in the width change part $A_w$, but rather occurs in either or both of the tabs 241, which do not cross a conductive layer. Thus, a short circuit between overlapping conductive layers and/or pixel failure may be prevented or reduced.

Figure 3A:
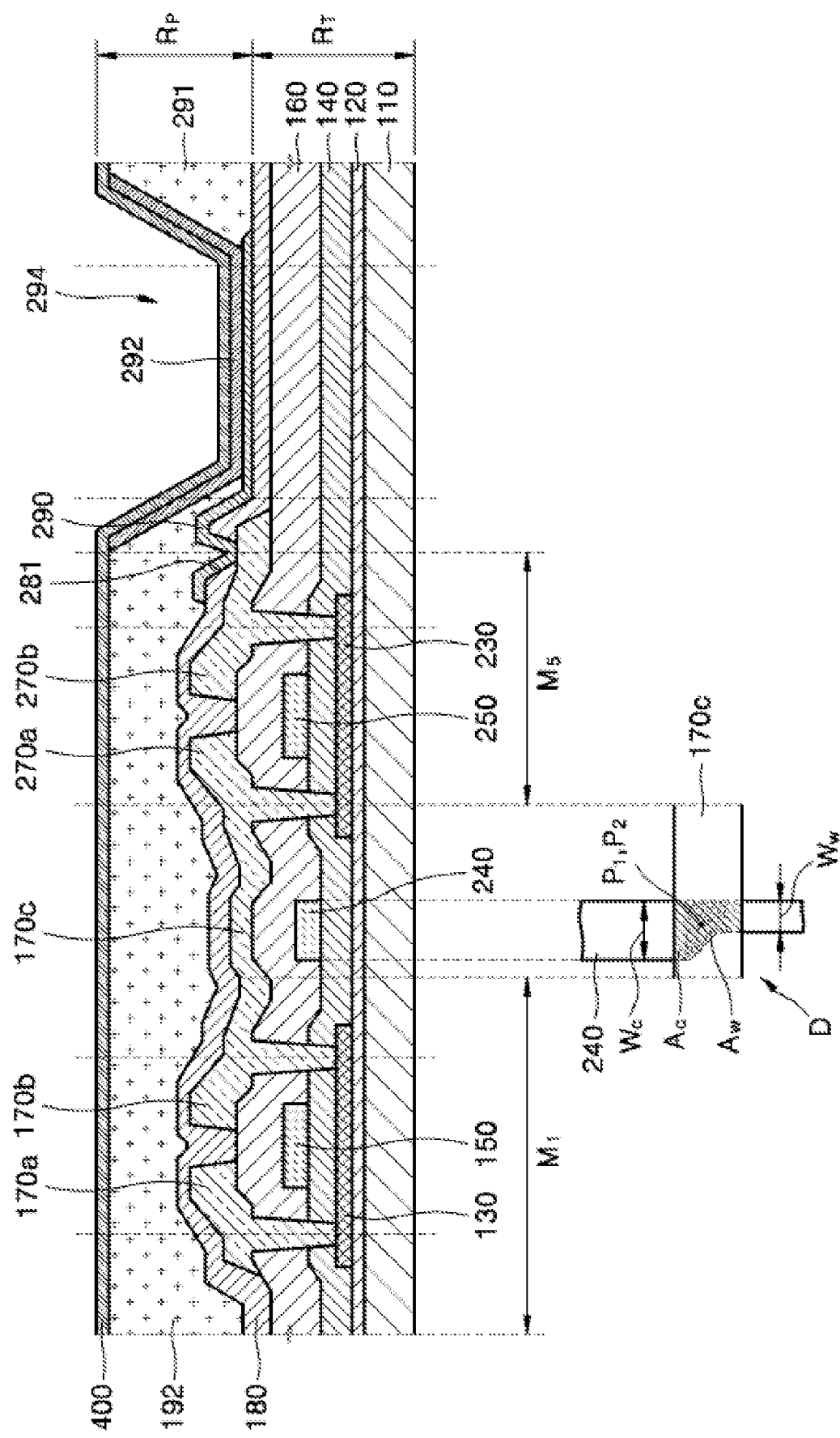
FIG. 3A is a partial cross-sectional view of a pixel indicated as C in FIG. 2A according to another embodiment of the present invention.
Figure 3B:
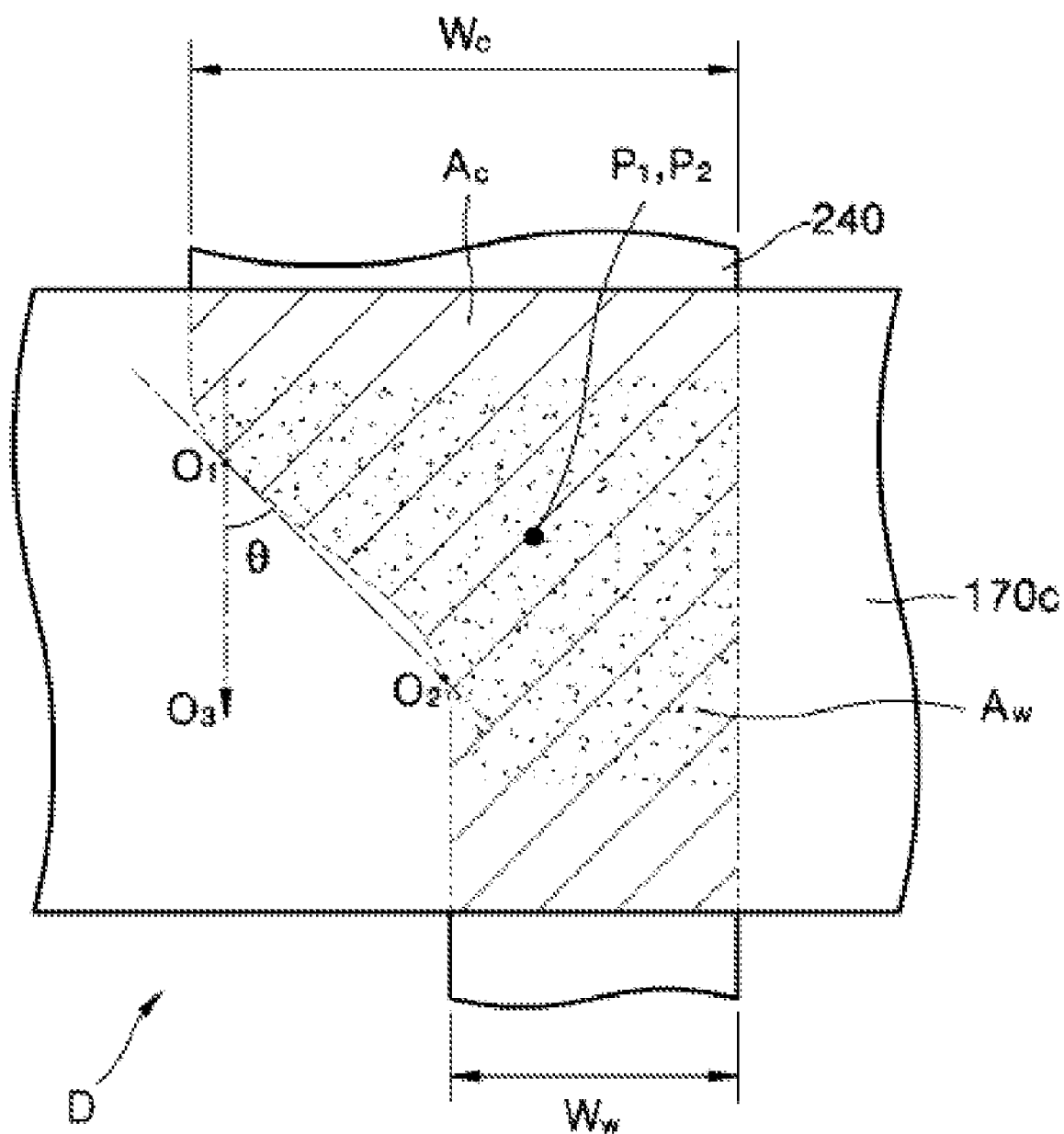
FIG. 3B is a magnified drawing of a portion indicated as D in FIG. 3A according to an embodiment of the present invention.
Figure 3C:
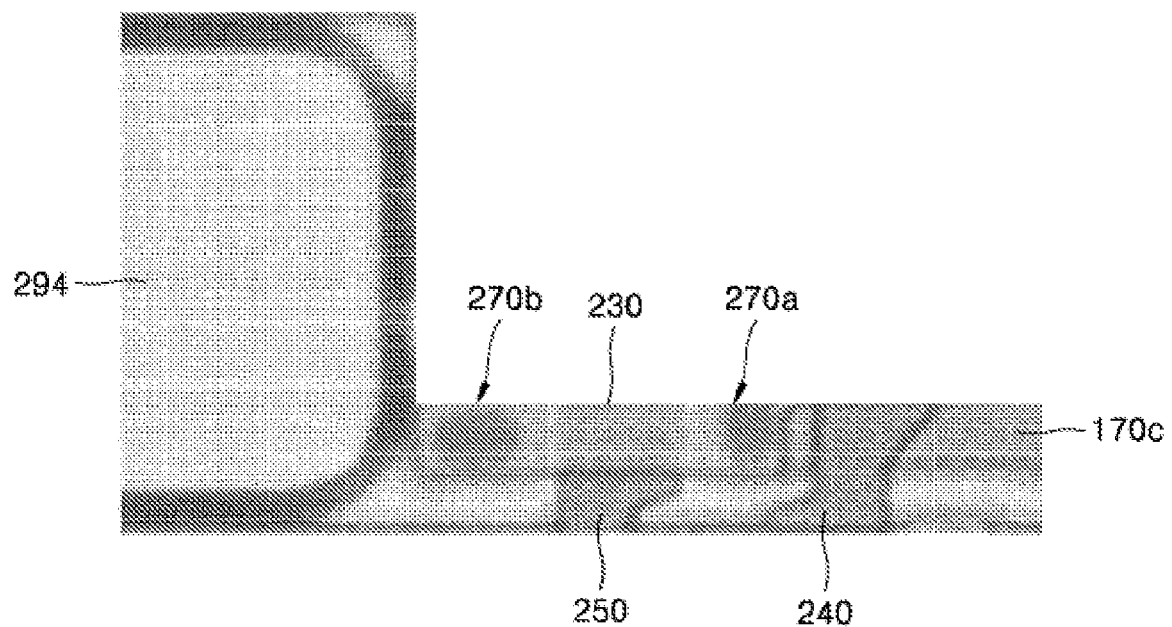
FIG. 3C is a partially magnified photograph of the pixel shown in FIG. 3A.

FIGS. 3A, 3B, and 3C illustrate a pixel of an OELD device manufactured according to the principles of the invention. A first scan line and/or a scan line extension unit 240 (hereinafter, a first scan line) are formed between a first TFT M1 and a fifth TFT M5. The first scan line 240 crosses, but does not contact the extension unit 170c of the drain electrode 170b of the first TFT M1. As depicted in FIG. 2B, the first scan line 240, which is a conductive layer to which an n-1$^{th}$ select signal $S_{[n-1]}$ is transmitted, transmits the n-1$^{th}$ scan signal $S_{[n-1]}$ to third and fourth TFTs M3 and M4. The first scan line 240 may include a width change part $A_w$, a width of which changes in a length direction of the first scan line 240. That is, as illustrated in the partial plan view depicted in FIG. 3A, the first scan line 240 may be formed as a conductive layer having a crossing region $A_c$ that crosses, but does not contact, at least a portion of the extension unit 170c extended from the drain electrode 170b. The first scan line may be disposed below the extension unit 170c. The first scan line 240 may include a width change part $A_w$ in a length direction of the first scan line 240, and the width of the width change part $A_w$ may change continually from $W_c$ to $W_w$.

As depicted in FIG. 3A, spots indicated as reference numerals P1 and P2 (refer to FIG. 2B) that are located in a crossing region of adjacent conductive layers might be readily damaged by the electrostatic discharge if the corresponding width change part included pointed ends. However, in an embodiment of the invention, the width change part $A_w$ does not include any sharp corner edges that might facilitate electrostatic discharge. Instead, the width of the width change part $A_w$ continually changes along the first scan line 240 such that the width change part includes corner edges that are curved and that have no 90° angles. Accordingly, the charges that cause electrostatic discharge do not concentrate in the width change part $A_w$, thereby preventing or reducing the electrostatic damage to pixels.

A corner of the width change part Aw preferably may have an obtuse angle and be rounded. FIG. 3B is a magnification of a portion D in FIG. 3A. Referring to FIG. 3B, an angle θ may be formed between a line segment $O_1$ and $O_2$ that extends from a point $O_1$ to a point $O_2$, both of which are located at the same plane of the width change part A that cross but do not contact each other, and a line segment $O_1$ and $O_3$ that extends from the point $O_1$ to a point $O_3$ positioned on a length direction of the first scan line 240. The angle θ may be less than 90°. To prevent the concentration of charges on the edge of the first scan line 240, the angle θ between the two segment lines may be less than 45°.

FIG. 3C is a partially magnified photograph of the pixel shown in FIG. 3A. Referring to FIG. 3C, since the width of the width change part $A_w$ of a conductive layer that crosses at least a neighboring conductive layer changes smoothly due to an obtuse angle, electrostatic damage to the conductive layers of the thin film transistor layer and/or a short circuit between the neighboring conductive layers may be prevented, thereby preventing the generation of faulty pixels.

The aforementioned embodiments are exemplary, and the present invention is not limited thereto. That is, the aforementioned embodiments are described with respect to a conductive layer formed between an extension part of a drain electrode and a scan line, but the present invention may be applied to other conductive layers. Also, the aforementioned embodiments are described with respect to a TFT structure having five top gate type transistors and two capacitors, as well as an OELD device that includes the TFT structure. However, the present invention may be modified in various forms such that a conductive layer having the width change part connects to a tab 241 at a region of the conductive layer that does not cross a neighboring conductive layer. Additionally, an angle between a line segment connecting corners of the width change part and a line segment parallel to the direction in which the conductive layer having the width change part extends may be less than 90°. The principles of the invention may also be applied to an OELD device and an LCD device regardless of the type of transistors. Further, the present invention may also be applied to an electronic device that has multiple conductive layers that cross but do not contact each other.

The present invention may provide some or all of the following advantages.

First, the inclusion of a tab 241 in a region of a conductive layer that does not cross a neighboring conductive layer and use of the invention's tabbed conductive layer in at least one TFT may prevent and/or reduce the electrostatic discharge damage to an insulating layer formed between the conductive layers from static electricity generated during the manufacture and/or operation of the TFT.

Second, in a flat display device such as an OELD that includes a TFT layer, where the TFT layer includes multiple conductive layers, a tab 241 connected to at least one conductive layer that has a width change part or to a neighboring conductive layer may prevent the generation of faulty pixels caused by electrostatic discharge provided the tab 241 is connected to a region of the conductive layer that does not cross the neighboring conductive layer. Such a configuration may improve image quality.

Third, a conductive layer that includes more than one TFT may include a portion thereof that crosses but does not contact a neighboring conductive layer. The conductive layer may include a width change part formed to substantially overlap the crossing region. The width of the width change part may vary continually such that the corners of the width change part are obtuse. Because no sharp corner edges are present to concentrate the electrostatic charge, damage to an insulating layer that is formed between the conductive layers due to electrostatic discharge may be prevented and/or reduced, thereby preventing product failure.

Fourth, in a flat display device such as an OELD that includes a TFT layer, a conductive layer having a region that crosses, but does not contact, a neighboring conductive layer may include a width change part. However, the possibility of faulty pixels occurring due to the static electricity generated during the manufacturing and/or operation of the TFT may be minimized or eliminated by preventing the concentration of static electricity in the width change part. This may be accomplished by varying the width of the width change part continually and rounding the corners thereof. Such a configuration may prevent or reduce the buildup of an electrostatic charge in the width change part, thereby improving the quality of images.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electronic device, comprising:
a first conductive layer; and
a second conductive layer perpendicular to the first conductive layer,
wherein the first conductive layer does not contact the second conductive layer,
wherein the first conductive layer comprises a width change part in a region where the first conductive layer crosses the second conductive layer, the width change part having a width that changes in a length direction of the first conductive layer,
wherein a width of the second conductive layer is constant in the region where the first conductive layer crosses the second conductive layer,
wherein an angle between a line segment that connects two points on a same plane of an outer line of the width change part and a line segment parallel to the length direction of the first conductive layer is less than 90°, and
wherein a width of the first conductive layer at a first intersection where the first conductive layer crosses a first side of the second conductive layer is greater than a width of the first conductive layer at a second intersection where the first conductive layer crosses a second side of the second conductive layer opposite the first side.

2. The electronic device of claim 1, wherein the first conductive layer is a gate electrode of a TFT or an extension part of the gate electrode of the TFT.

3. The electronic device of claim 1, wherein the first conductive layer is a source or drain electrode of a TFT, or an extension part of the source or drain electrode of the TFT.

4. A TFT structure, comprising:
a first conductive layer; and
a second conductive layer perpendicular to the first conductive layer,
wherein the first conductive layer does not contact the second conductive layer,
wherein the first conductive layer comprises a width change part in a region where the first conductive layer crosses the second conductive layer, the width change part having a width that changes in a length direction of the first conductive layer,
wherein a width of the second conductive layer is constant in the region where the first conductive layer crosses the second conductive layer,
wherein an angle between a line segment that connects two points on a same plane of an outer line of the width change part and a line segment parallel to the length direction of the first conductive layer is less than 90°, and
wherein a width of the first conductive layer at a first intersection where the first conductive layer crosses a first side of the second conductive layer is greater than a width of the first conductive layer at a second intersection where the first conductive layer crosses a second side of the second conductive layer opposite the first side.

5. The TFT structure of claim 4, wherein the first conductive layer is a gate electrode of the TFT or an extension part of the gate electrode.

6. The TFT structure of claim 4, wherein the first conductive layer is a source or drain electrode of the TFT, or an extension part of the source or drain electrode of the TFT.

7. A flat display device, comprising:
a substrate;
a TFT layer formed on the substrate; and
a pixel layer that comprises more than one pixel electrically connected to the TFT layer,
wherein the TFT layer comprises a first conductive layer and a second conductive layer perpendicular to the first conductive layer,
wherein the first conductive layer does not contact the second conductive layer,
wherein the first conductive layer comprises a width change part in a region where the first conductive layer crosses the second conductive layer, the width change part having a width that changes in a length direction of the first conductive layer,
wherein a width of the second conductive layer is constant in the region where the first conductive layer crosses the second conductive layer, and
wherein an angle between a line segment that connects two points on a same plane of an outer line of the width change part and a line segment parallel to the length direction of the first conductive layer is less than 90°.

8. The flat display device of claim 7, wherein the first conductive layer is a gate electrode.

9. The flat display device of claim 7, wherein the first conductive layer is a source or drain electrode.

10. The flat display device of claim 7, wherein the pixel layer comprises:
a first electrode;
an electroluminescent unit formed on the first electrode; and
a second electrode formed on the electroluminescent unit.

11. The flat display device of claim 7, further comprising at least one insulating layer formed over the TFT layer, wherein the pixel of the pixel layer is electrically connected to the TFT layer through a contact hole formed in the at least one insulating layer.

12. An electronic device, comprising:
a first conductive layer; and
a second conductive layer perpendicular to the first conductive layer,
wherein the first conductive layer does not contact the second conductive layer,
wherein the first conductive layer comprises a part whose cross-sectional area changes in a length direction of the first conductive layer, the part being in a region where the first conductive layer crosses the second conductive layer,
wherein a width of the second conductive layer is constant in the region where the first conductive layer crosses the second conductive layer, and
wherein an angle between a line segment that connects two points on a same plane of an outer line of the part whose cross-sectional area changes and a line segment parallel to the length direction of the first conductive layer is less than 90°, and
wherein a width of the first conductive layer at a first intersection where the first conductive layer crosses a first side of the second conductive layer is greater than a width of the first conductive layer at a second intersection where the first conductive layer crosses a second side of the second conductive layer opposite the first side.

13. The electronic device of claim 12, wherein the first conductive layer is a gate electrode of a TFT or an extension part of the gate electrode of the TFT.

14. The electronic device of claim 12, wherein the first conductive layer is a source or drain electrode of a TFT, or an extension part of the source or drain electrode of the TFT.

15. A TFT structure, comprising:
a first conductive layer; and
a second conductive layer perpendicular to the first conductive layer,
wherein the first conductive layer does not contact the second conductive layer,
wherein the first conductive layer comprises a part whose cross-sectional area changes in a length direction of the first conductive layer, the part being in a region where the first conductive layer crosses the second conductive layer,
wherein a width of the second conductive layer is constant in the region where the first conductive layer crosses the second conductive layer, and
wherein an angle between a line segment that connects two points on a same plane of an outer line of the part whose cross-sectional area changes and a line segment parallel to the length direction of the first conductive layer is less than 90°, and
wherein a width of the first conductive layer at a first intersection where the first conductive layer crosses a first side of the second conductive layer is greater than a width of the first conductive layer at a second intersection where the first conductive layer crosses a second side of the second conductive layer opposite the first side.

16. The TFT structure of claim 15, wherein the first conductive layer is a gate electrode of the TFT or an extension part of the gate electrode.

17. The TFT structure of claim 15, wherein the first conductive layer is a source or drain electrode of the TFT, or an extension part of the source or drain electrode of the TFT.

18. A flat display device, comprising:
a substrate;
a TFT layer formed on the substrate; and
a pixel layer that comprises more than one pixel electrically connected to the TFT layer,
wherein the TFT layer comprises a first conductive layer and a second conductive layer perpendicular to the first conductive layer,
wherein the first conductive layer does not contact the second conductive layer,
wherein the first conductive layer comprises a part whose cross-sectional area changes in a length direction of the first conductive layer, the part being in a region where the first conductive layer crosses the second conductive layer,
wherein a width of the second conductive layer is constant in the region where the first conductive layer crosses the second conductive layer, and
wherein an angle between a line segment that connects two points on a same plane of an outer line of the part whose cross-sectional area changes and a line segment parallel to the length direction of the first conductive layer is less than 90°.

19. The flat display device of claim 18, wherein the first conductive layer is a gate electrode.

20. The flat display device of claim 18, wherein the first conductive layer is a source or drain electrode.

21. The flat display device of claim 18, wherein the pixel layer comprises:
a first electrode;
an electroluminescent unit formed on the first electrode; and
a second electrode formed on the electroluminescent unit.

22. The flat display device of claim 18, further comprising at least one insulating layer formed over the TFT layer, wherein the pixel of the pixel layer is electrically connected to the TFT layer through a contact hole formed in the at least one insulating layer.

* * * * *